(12) United States Patent
Aitken et al.

(10) Patent No.: US 6,573,026 B1
(45) Date of Patent: Jun. 3, 2003

(54) FEMTOSECOND LASER WRITING OF GLASS, INCLUDING BOROSILICATE, SULFIDE, AND LEAD GLASSES

(75) Inventors: Bruce G. Aitken, Corning, NY (US); Nicholas F. Borrelli, Elmira, NY (US); David L. Morse, Corning, NY (US); Alexander Streltsov, Corning, NY (US)

(73) Assignee: Corning Incorporated, Corning, NY (US)

( * ) Notice: Subject to any disclaimer, the term of this patent is extended or adjusted under 35 U.S.C. 154(b) by 242 days.

(21) Appl. No.: 09/628,666

(22) Filed: Jul. 28, 2000

Related U.S. Application Data

(60) Provisional application No. 60/172,122, filed on Dec. 17, 1999, and provisional application No. 60/146,274, filed on Jul. 29, 1999.

(51) Int. Cl.[7] .................................................. G02B 6/18
(52) U.S. Cl. ...................... 430/290; 430/321; 430/945; 385/123; 385/141
(58) Field of Search ................................ 430/290, 321, 430/945; 385/123, 141

(56) References Cited

U.S. PATENT DOCUMENTS

| | | | |
|---|---|---|---|
| 4,270,130 A | 5/1981 | Houle et al. ............. 346/135.1 |
| 4,641,924 A | 2/1987 | Nagae et al. ............ 350/339 R |
| 4,847,138 A | 7/1989 | Boylan et al. ............... 428/209 |
| 5,157,674 A | 10/1992 | Lawandy ..................... 385/141 |
| 5,178,978 A | 1/1993 | Zanoni et al. ............... 430/290 |
| 5,253,198 A | 10/1993 | Birge et al. .................. 365/106 |
| 5,285,517 A | 2/1994 | Wu .............................. 385/142 |
| 5,289,407 A | 2/1994 | Strickler et al. ............. 365/106 |
| 5,325,324 A | 6/1994 | Rentzepis et al. ........... 365/106 |
| 5,627,933 A | 5/1997 | Ito et al. ....................... 385/123 |
| 5,656,186 A | 8/1997 | Mourou et al. ......... 219/121.69 |
| 5,675,691 A | 10/1997 | Edlinger et al. ............. 385/130 |
| 5,761,111 A | 6/1998 | Glezer ......................... 365/106 |
| 5,841,928 A | 11/1998 | Maxwell et al. ............. 385/129 |
| 5,919,607 A | 7/1999 | Lawandy ..................... 430/321 |
| 5,978,538 A | * 11/1999 | Miura et al. ................. 385/123 |
| 6,075,625 A | 6/2000 | Ainslie et al. ................... 359/3 |

FOREIGN PATENT DOCUMENTS

| | | | |
|---|---|---|---|
| EP | 0 569 182 | 12/1997 | ............ G02B/6/16 |
| JP | 11-255536 | 9/1999 | ............ C03C/4/12 |
| WO | 93/16403 | 8/1993 | ............ G02B/6/12 |

OTHER PUBLICATIONS

Itoh et al. Fabrication of Small Bragg Reflectors in Glass with Refractive Index Change Induced by Ultrashort Laser Pulses, Proc. SPIE, vol. 3801 pp. 158–168 (Jul. 1999).*

Yu et al., 'Microstructuring with Femtosecond Laser Inside Silica Glasses', CLEO '99, pp 356–357 (May 1999).*

Schaffer et al., Laer Induced Micro–explosions in Transparent Materials : Microstructuring with Nanojoules, Proc. SPIE, vol. 3616 (Jan. 1999).*

Kondo et al. "Three Dimensional Microdrilling of Glass by Multiphoton Process and Chemical Etching.", Jpn. J. Appl. Phys., Pa 2 (letters) vol. 38 (10A), pp L1146–1148. (1999).*

Kondo et al. "Three Dimensional Arrays of Crystallites Within Glass by Using Non–Resonant Femtosecond Pulses.", J. Non–Crystall. Sol., vol. 253, pp 143–156. (1999).*

(List continued on next page.)

*Primary Examiner*—Martin Angebranndt
(74) *Attorney, Agent, or Firm*—Edward F. Murphy; Thomas B. Ryan

(57) ABSTRACT

A method of writing a pattern, such as a waveguide, in a bulk glass substrate. The bulk glass substrate can be formed from, for example, borosilicate or sulfide or lead glass. A pulsed laser beam is focused within the substrate while the focus is translated relative to the substrate along a scan path at a scan speed effective to induce an increase in the refractive index of the material along the scan path. Substantially no laser induced physical damage of the material is incurred along the scan path. Various optical devices can be made using this method.

19 Claims, 17 Drawing Sheets

OTHER PUBLICATIONS

Schaffer et al. "Micromachining Optical Waveguides in Bulk Glass Using a Femtosecond Laser Oscillator", CLEO 2000, pp. 375–376 (May 2000).*

Miura et al. "Preparation and Optical Properties of Fluorides Glass Waveguides Induced by Laser Pulses" J. Non–Crystyal. Sol. vol. 256–257 pp. 212–219 (1999).*

Kondo, Y et al., Three–dimensional microscopic crystallization in photosensitive glass by femtosecond laser pulses at nonresonant wavelength Japanese Journal of Applied Physics, Part 2, vol. 37, No. 1A–B, Jan. 1998.

George H. Beall, Industrial Applications of Silica, Reviews in Mineralogy, vol. 29, pp. 469–505.

K. Hirao et al., Writing Waveguides in Silica–related Glasses with Femtosecond Laser, Technical Digest, Jul. 1997, pp. 103–105.

N.F. Borrelli et al., Densification of fused silica under 193–nm excitation, J. Opt. Soc. Am. B/vol. 14, No. 7, Jul. 1997, pp. 1606–1615.

K. Hirao, K. Miura, Writing waveguides and gratings in silica and related materials by a femtosecond laser, Journal of Non–Crystalline Solids 239 (1998), pp. 91–95.

Yuki Kondo et al., Fabrication of long–period fiber gratings by focused irradiation of infrared femtosecond laser pulses, Optics Letters/vol. 24, No. 10, May 15, 1999, pp. 646–648.

K. M. Davis et al., Writing waveguides in glass with a femtosecond laser, Optics Letters vol. 21, No. 21, Nov. 1, 1996, pp. 1729–1731.

N. F. Borrelli et al., Excimer–laser–induced densification in binary silica glasses, Optics Letters/vol. 24, No. 20, Oct. 15, 1999, pp. 25–27.

K. Miura et al.Photowritten optical waveguides in various glasses with ultrashort pulse laser, Appl. Phys. Lett. 71 (23), Dec. 8, 1997, pp. 3329–3331.

Corning Incorporated, May 1999, HPFS® Standard Grade, www.hpfs.coring.com.

Corning Incorporated, May 1999, HPFS® ArF Grade, www.hpfs.corining.com.

Corning Incorporated, May 1999, HPFS® KrF Grade, www.hpfs.corining.com.

CYMER—Products: 193 nm ArF Product Family, Sep. 21, 2000, pp. 1–2.

CYMER—Products: 248 nm KrF Product Family, Sep. 21, 2000, pp. 1–2.

CYMER—Products: Background, Sep. 21, 2000, pp. 1–2.

Coherent—Products—Lasers—Ion—Innova FreD, Innova FRED Lasers, Sep. 21, 2000, pp. 1–2.

Coherent—Laser Applications—Lithography, Sep. 21, 2000, pp. 1–2.

Coherent, Frequency–Doubled Ion Laser System, 1996, pp. 1–2.

Positive Light, Sep. 21, 2000.

Positive Light, Indigo—SLM, preliminary data sheet, Oct. 1999, pp. 1–2.

Positive Light, Indigo—DUV, May 2000, pp. 1–2.

Positive Light, Custom Lasers, Oct. 1999, pp. 1–2.

Positive Light New Products, Sep. 21, 2000, pp. 1–2.

Borreli et al., USSN 09/627,868, filed Jul. 28, 2000, Direct Writing of Optical Devices in Silica–Based Glass Using Femtosecond Pulse Lasers.

Allan et al., USSN 09/675,721, filed Sep. 29, 2000, Deep UV Laser Internally induced Densification in Silica Glasses.

Robert R. Krchnavek et al., Laser direct writing of channel waveguides using spin–on polymers, J. Appl. Phys. 66(11), Dec. 1, 1989, pp. 5156–5160.

D. Homoelle, S. Wielandy, A. Gaeta, N. Borrelli & C. Smith, Opt. Lett. 24, 1311 (1999).

E. Glezer, M. Milosavlievic, L. Huang, R. Finlay, T. H. Her, J.P. Callan & E. Mazur, Opt. Lett. 21, 2023 (1996).

C. Schaffer, A. Brodeur, J. Garcia, W. Leight & E. Mazur, in Conference on Lasers and Electro–Optics (CLEO), 2000 OSA Technical Digest Series (Optical Society of America, Washington, D.C. 2000) paper CWT4.

D. Brooks and S. Ruschin, IEEE Photonic Technol. Lett. 8, 254 (1996).

P. Oberson, B. Gisin, B. Huttner & N. Gisin, Appl. Opt. 37, 7268 (1998).

* cited by examiner

10μm

FEMTOSECOND LASER WRITING OF GLASS, INCLUDING BOROSILICATE, SULFIDE, AND LEAD GLASSES

CROSS REFERENCE TO RELATED APPLICATIONS

This application claims priority to the U.S. Provisional Patent Application Serial No. 60/146,274, filed Jul. 29, 1999, entitled Direct Writing of Optical Devices in Silica-Based Glass Using Femtosecond Pulse Lasers of Nicholas F. Borrelli and Charlene Smith and the U.S. Provisional Patent Application Serial No. 60/172,122, filed Dec. 17, 1999, Femtosecond Laser Writing Of Glass, Including Borosilicate, Sulfide and Lead Glasses of Nicholas F. Borelli, David L. Morse, Alexander Streltsov and Bruce Aitken.

BACKGROUND OF THE INVENTION

1. Field of the Invention

The present invention relates to the use of femtosecond lasers to treat or expose glass, to form a pattern, such as a waveguide. The method can be used to form optical devices, such as light guiding structures. The invention also relates to waveguides formed in glass.

2. Description of Related Art

Optical devices such as optical waveguides and Bragg diffraction gratings are widely known in the telecommunications field. In an optical waveguide, a higher refractive index core surrounded by a lower refractive index cladding can transmit a large amount of optical information over long distances with little signal attenuation. The optical waveguide fiber is the prototype device of this type. The fiber is produced by a method that, by virtue of its fabrication, gives the proper waveguiding structure. A Bragg grating is another type of optical device that can be used to isolate a narrow band of wavelengths from a broader signal. The most common materials used commercially in telecommunications applications of light guiding devices are doped silica-based compositions.

It is known that pulsed laser sources can be used to effect both index changes and to produce physical damage in glass. With regard to the former, the use of pulsed UV radiation sources for writing Bragg gratings is known. Recently, a "direct-write" laser method of forming optical waveguides within a glass volume that is transparent to the wavelength of a femtosecond laser has been disclosed. In this method, a 120 fs pulsed 810-nm laser is focused within a polished piece of germania-doped silica as the glass is translated perpendicular to the incident beam through the focus. Increases in refractive index on the order of $10^{-2}$ were reported for a specific condition in which the focus was scanned ten times over the exposed area. See K. Hirao and K. Miura, J. Non-Cryst. Sol 235, pp. 31–35, 1998.

One potential problem with a direct write process of forming waveguides in bulk glass using short-pulse focused lasers is that of over-exposure. Irradiation with too much energy can lead to physical damage in the glass. Physical damage results in undesired attenuation of optical signals transmitted through the glass.

Another problem in direct write methods of making optical structures relates to the trade-off between the stability of the writing device, e.g., the laser, and the energy necessary to induce the desired refractive index change in the substrate material.

A femtosecond laser system is one generating a train of optical pulses with temporal widths of 10–200 fs. The femtosecond laser system is generally a femtosecond mode locked oscillator, referred to herein as a femtosecond laser. The repetition rate and the energy per pulse are a function of the particular system. In general, the systems include an oscillator (a system that delivers energy) from which the pulse train is developed. The maximum energy per pulse is about 1–10 nJ. The repetition rate, which is essentially the round trip time in the cavity, can be very high, on the order of 100 MHz. If more energy is needed, an amplifier section is added. Here, the pulse is broadened to reduce the intensity, amplified, and then the pulse is compressed. One can achieve mJ levels of energy but at the expense of the repetition rate. Depending on the specific amplification scheme and ultimate pulse width, the repetition rate can range from 1 kHz to 250 kHz. Another approach is the so-called "cavity-dumped" approach. These three approaches are summarized in the following Table I.

TABLE I

|  | Oscillator | Amplifier | Cavity Dump |
| --- | --- | --- | --- |
| Pulse Duration (fsec) | <40 | 40–150 | <40 |
| Energy Range | 1–10 nj | About 1 mJ | 1–50 nJ |
| Rep Rate | ≦100 MHz | 1–250 kHz | <1 MHz |
| Mode Quality | Good | Poor | Good |
| Stability | Good | Poor | Not as stable as oscillator system |

The table above illustrates the operational trade-offs as a consequence of how the laser is configured. While it is relatively easy to obtain a 100 MHz repetition rate using the oscillator mode when the pulse energy is less than 10 nJ, at the $\mu$J level of energy the repetition rate is traded off and drops to the several kHz range. Mode quality, which is qualitatively described by the temporal and spatial integrity of the beam, is relatively poor in the amplified system and improves when the oscillator is used. Similarly, the overall stability of the laser is found to be more robust in the oscillator case. These parameters turn out to be of practical importance in direct-write methods of making optical devices where one needs to control the pointing stability of the laser beam in order to write closely spaced optical structures in the substrate, such as diffraction grating lines.

To make the femtosecond laser direct-write method practical, large changes in the refractive index, such as $>10^{-3}$, of a material should be achieved in a reasonable amount of writing time. The formation of laser-induced physical damage should also be avoided. There is a need to find materials that can meet the requirements of large refractive index change, without physical damage to the material. It is also a desire to be able to use the relatively low energy of the oscillator, without needing an amplifier, in producing optical devices, such as waveguides.

Moreover, there continues to be a need for a practical direct write method of creating optical devices having a sufficiently increased refractive index at an acceptably high write rate. Such a method could be used to write continuous light-guiding waveguide patterns connecting any two points within a continuous block of a suitable material, or make other optical devices, such as Bragg gratings.

SUMMARY OF THE INVENTION

In accordance with these and other needs, there has been provided according to the invention a method of writing a pattern in a bulk glass substrate having an absorption edge ($\lambda_g$), including focusing a pulsed laser beam having a wavelength ($\lambda_{ex}$) such that $\lambda_g \angle \lambda_{ex} \angle 2\lambda_g$ at a focus within said substrate while translating the focus relative to the substrate along a scan path at a scan speed effective to induce an increase in the refractive index of the material along the scan path relative to that of the unexposed material while incurring substantially no laser induced breakdown of the material along the scan path.

In accordance with these and other needs, there has also been provided according to the present invention, a method of writing a pattern in a bulk glass substrate selected from the group consisting of borosilicate, lead, and sulfide glass, including focusing a pulsed laser beams at a focus within said substrate while translating the focus relative to the substrate along a scan path at a scan speed effective to induce an increase in the refractive index of the material along the scan path relative to that of the unexposed material while incurring substantially no laser induced breakdown of the material along the scan path.

In accordance with the present invention, there has also been provided an optical device, such as a waveguide, .formed from one or more of borosilicate, lead, and sulfide glass that has had an induced refractive index change.

Further objects, features, and advantages of the invention will become apparent from the detailed description that follows.

DETAILED DESCRIPTION OF PREFERRED EMBODIMENTS

Figure 1:
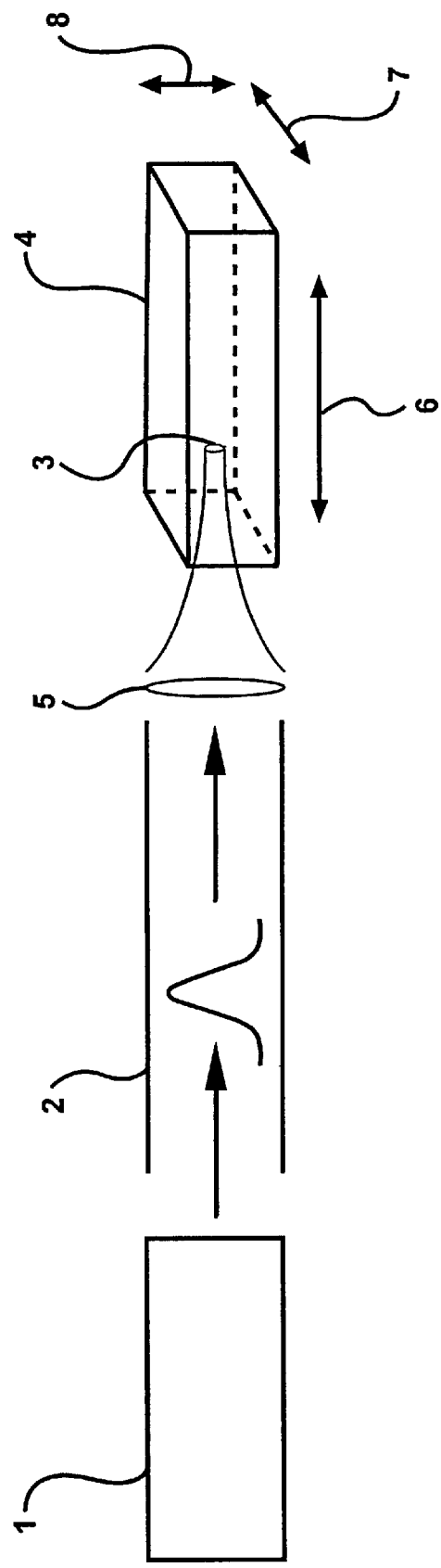
FIG. 1 is a schematic arrangement of equipment that can be used in practicing the invention.

It has been found by the present inventors that if the absorption edge of the glass is within two photons of the wavelength output of the laser, that unexpectedly large changes in refractive index can be created, even if low energy from an oscillator is used. This finding is represented by the following formula A $$\lambda_g \angle \lambda_{ex} \angle 2\lambda_g \tag{A}$$

where $\lambda_{ex}$ is the wavelength of the laser output;

$\lambda_g$ is the absorption edge of the glass.

The absorption edge of a specific is glass is well understood and can be measured by techniques known by those in the art. For example, the absorption edge can be the wavelength at which the absorbance/cm is about 2.

Any glass and laser can be selected so long as the above criteria are met. For example, for a sulfur glass, $\lambda_{ex}$ can be about 780 to about 830 nm, and for a borosilicate glass, the $\lambda_{ex}$ can be about 390–415. While any glass can be used, it is not necessary to use glass containing germanium or glass doped with hydrogen as required in prior method of making diffraction gratings. Therefore, the glass can be free of germanium and/or free of doped hydrogen.

It has been found that if the relationship between the excitation wavelength and the wavelength of the laser is as above, that low energy (less than about 10 nJ), such as obtained from an oscillator, can be used to write waveguides in certain distinct glass compositions, namely borosilicate glasses, lead, and sulfide glasses. For example, one can obtain refractive index changes of greater than 0.001 with a relatively low beam intensity of $10^{10}$–$10^{11}$ W/cm$^2$ as obtained from the output of a fs-oscillator, with an energy per pulse of about 1–10 nJ. In previous reports of fs-laser induced refractive index changes (for example, see Hirao et al., J. Non-Cryst. Soc. 235, 31–35, 1998), the intensity was 100–1000 times higher and was obtained from the output of an amplifier.

In the invention, one can also focus light tighter using short-focus lengths to get higher intensities on the order of $10^{12}$ to $10^{14}$ W/cm$^2$. However, this is often achieved at the expense of working distance of the lens thus limiting the length of the waveguide.

It is advantageous to be able to write in glass using an oscillator because there is better temporal and pointing stability of the beam. This leads to a more uniform waveguide formed compared to when an amplified laser system is used. Applicants are believed to be the first to use oscillators to form waveguides. Disadvantageously, if operated in the amplifier mode, it is relatively easy for the beam shape to become distorted which then translates to the shape of the waveguide.

The invention allows for the writing in a particular glass using the low energy as obtained from an oscillator. The ability to write a small (on the order of several micrometers) spot at an arbitrary position in a cube of glass is a function of the intensity dependence of the interaction that leads to the optical change. This change can manifest itself as optical absorption, refractive index change, or physical damage.

If the dependence on the intensity is of the form $I^m$, m being the order of the process, then it is possible to have the interaction occur only at the focus of the beam. This is the case because intensity in the entrance cone up to the focal point is too weak to effect the interaction. The larger the value of m, the more this will be so and the smaller the spot will be for a given focusing lens. The maximum depth to which one can write is ultimately limited by the working distance of the writing lens, consistent with the writing intensity.

The present invention provides three classes of materials that make such writing especially practical, namely borosilicate, sulfide, and lead glasses. While the mechanism of the interaction of the glass with the fs-laser is not clear, it is believed that because of the shortness of the pulse duration, the excited photo-electrons cannot thermally relax since the pulse duration is shorter than the lattice thermalization time. With high enough intensities and the inability for the electrons to relax, one can build up a relatively high electron density. It is sufficiently high to be considered a plasma. (A plasma is a collection of electrons essentially acting as a free electron gas). How the structure is permanently changed as a result of this is not known. It is possible that it is related to a densification similar to what has been reported as occurring in materials after high energy excitation such as gamma-rays or uv-excimer laser.

Applicants have investigated the sensitivity of various glasses to fs-laser exposure. It has been found that the exposure energy required to induce a measurable refractive index change can vary by orders of magnitude depending on the specific glass composition. It has been found that a significant factor influencing the interaction is the excitation wavelength of the fs-source ($\lambda_{ex}$) relative to the intrinsic absorption of the glass ($\lambda_g$). If the excitation wavelength is within two-photon excitation range of the intrinsic absorption edge, as set out in the above formula then it has been practical to induce index change of the order of $10^{-3}$ with pulse energy less than 10 nJ, for example as low as 1 nJ. This is in contrast to the energy (which can be 1000 times larger) required to produce a comparable index change when the excitation wavelength is far from the intrinsic absorption edge.

The method of forming patterns in a bulk substrate according to the invention includes the steps of selecting a substrate made from, for example, one of borosilicate, sulfide, or lead glasses in which the pattern is to be written, focusing a pulsed laser beam at a position within the substrate effective to induce an increase in the refractive index of a portion of the irradiated material, and translating the substrate and focus with respect to one another to form a pattern, such as a light guiding structure within the substrate along the scan path.

The method may be better understood by reference to a generalized arrangement of an equipment set-up suitable for practicing the invention, as shown in FIG. 1. Femtosecond Laser 1 generates a pulsed laser beam 2 which is focused at a focus 3 positioned within glass sample 4 by a lens 5. The sample is translated in one or more of the x-direction 6, y-direction 7, and z-direction 8 to effect translation of the sample with respect to the laser beam focus at a desired translation or scan speed. Such translation of the sample with respect to the focal point may be accomplished by a positioning or translation device (not shown), such as a computer controlled XYZ stage.

The high intensity of the focused beam effects an increase in the refractive index of the glass along the path traced by the beam focus as it is translated through the sample. The resulting region of increased refractive index form a pattern, for example, that can guide light and therefore can function as an optical waveguide.

Figure 2B:
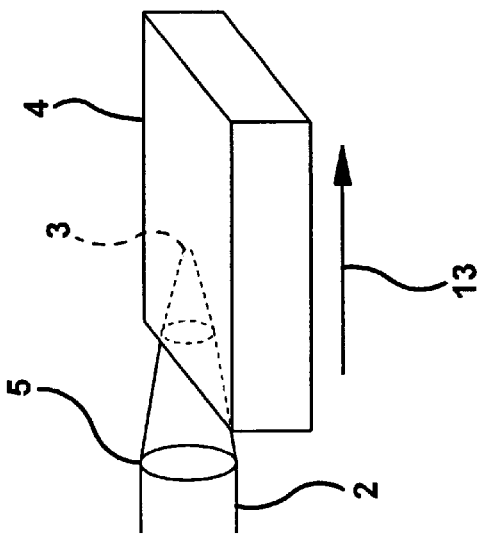
FIG. 2(a) and FIG. 2(b) show a positioning of the incident laser beam relative to the scan direction in the top-write and axial-write orientations, respectively.

An "axial writing" method results from translating the sample in a scan direction 13 that is substantially parallel to the incident beam, as shown in FIG. 2(b).

Figure 2A:
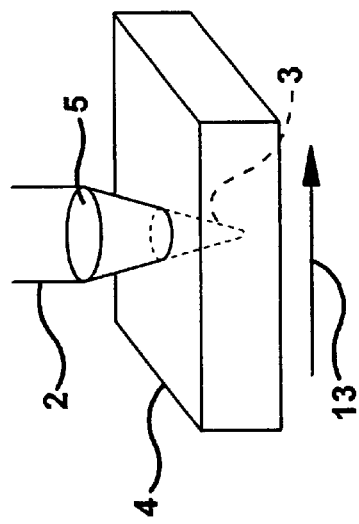

A "top writing" method results from translating the sample in a scan direction 13 that is substantially perpendicular to the incident beam, as shown in FIG. 2(a). As the skilled artisan will readily appreciate, top-writing may also be accomplished by translating the sample in just the x-direction, just the y-direction, or both the x-direction and y-direction simultaneously. The top writing method writes with the beam with the dimension of the confocal parameter in one direction. This produces an asymmetric waveguide. See the discussion in the next paragraph related to FIGS. 3(a) to 3(d).

Figure 3B:
FIG. 3(a) and FIG. 3(b) show a scanning beam profile and waveguides cross-sectional shape in the top-write orientations, respectively.
Figure 3D:
FIG. 3(c) and FIG. 3(d) show a scanning beam profile and waveguides cross-sectional shape in the axial-write orientations, respectively.
Figure 3A:
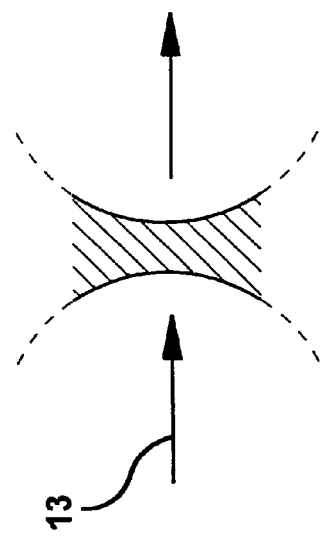
Figure 3C:
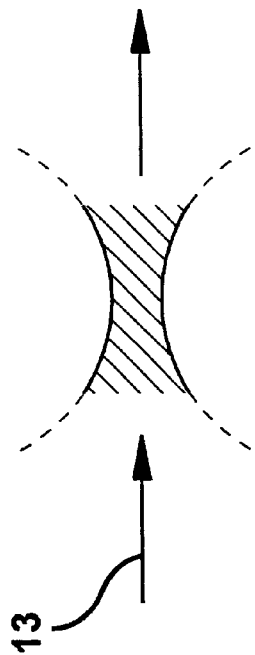

The focus profile and cross-sectional shape of top-written patterns shown in FIG. 3(a) and FIG. 3(b) differ from those of axial-written patterns, as shown in FIG. 3(c) and FIG. 3(d). The beam profile in the vicinity of the focus relative to the scan direction 13 is shown for the top-write orientation in FIG. 3(a) and for the axial-write orientation in FIG. 3(c), respectively. When the top-write focus is translated through the sample in the scan direction, a generally ellipsoid cross-section of the pattern may be produced, as indicated by FIG. 3(b). When the axial-write focus is translated through the sample in the scan direction, a generally circular cross-section of the pattern often results, as indicated by FIG. 3(d). Accordingly, axially-written patterns are generally preferred in order to produce patterns or waveguides having substantially circular cross-sections. Top-writing may be desired in order to write continuous linear patterns longer than the focal length of the focusing lens. Again, the pattern may function as a waveguide.

Figure 4B:
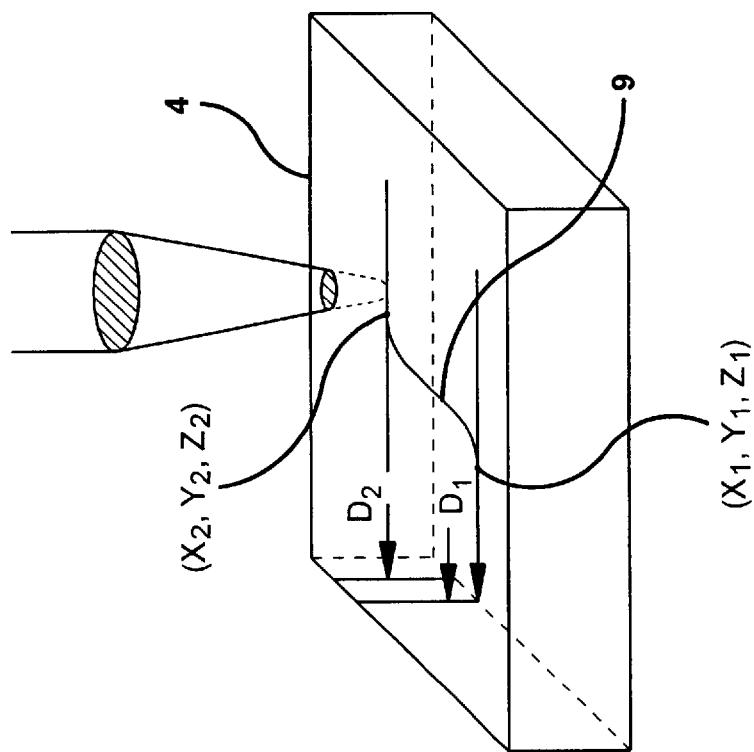
FIG. 4(a) and FIG. 4(b) are perspective views of the top-write arrangement of directly writing three dimensional optical devices in bulk glass.
Figure 4A:
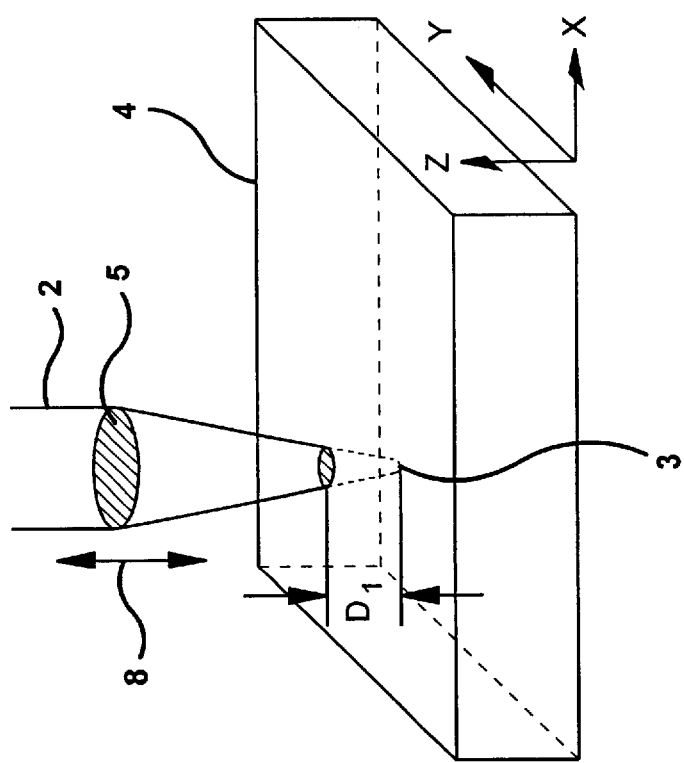

The ability to write three-dimensional patterns in a sample using the present direct-write method is described further with reference to FIGS. 4(a) and 4(b). The laser beam 2 can be focused by a lens 5 to a focus 3 positioned within glass sample 4. Translation of the sample in the x-, y-, and z-directions from a first position ($x_1, y_1, z_1$) at depth $D_1$ to a second position ($x_2, y_2, z_2$) at depth $D_2$ causes an increase in the refractive index of the glass along the scan path 9 to form a pattern extending in three dimensions between the first and second positions within the sample. If planar, i.e., two-dimensional, waveguides are desired, $x_1$ may be the same as $x_2$, $y_1$ may be the same as $y_2$, or $z_1$ may be the same as $z_2$. If linear waveguides are desired, $x_1$ and $y_1$ may be the same as $x_2$ and $y_2$, respectively, $y_1$ and $z_1$ may be the same as $y_2$ and $z_2$, respectively, or $x_1$ and $z_1$ may be the same as $x_2$ and $z_2$, respectively.

The pulsed laser beam is characterized by several beam parameters. The beam parameters include the wavelength, pulse duration or pulse width, pulse energy, and repetition rate. For example, the laser wavelength and sample are selected to minimize linear optical absorption of the beam energy by the sample. The wavelength $\lambda_{ex}$ should satisfy formula A above. Alternatively, in some embodiments $\lambda_{ex}$ can be within about 100 nm of the absorption edge of the glass sample. Thus, for a borosilicate glass, the range is preferably about 380–420 nm. For a sulfide glass, the range can be about 760 to about 850 nm. These ranges can be achieved with a Ti-Sapphire laser.

The time duration of each pulse, a.k.a., the pulse width, is preferably less than about 100 fs. More preferably, the pulse duration is less than about 80 fs, or less than 35 fs, for example from 20–100 fs.

The energy per pulse can be less than 10 nJ, for example, from about 0.5 nJ to about 10 nJ, preferably within the range of about 1 to about 3 nJ.

The repetition rate or pulse frequency can range from 0.5 to about 100 MHz, for example, from 70–90 MHz.

Beam intensity can vary from, for example, $10^{10}$–$10^{14}$ W/cm$^2$.

The laser can be any device capable of generating a femtosecond pulsed laser beam that satisfies the desired parameters. The laser may be, for example, a Ti:Sapphire mode-locked oscillator, or an equivalent laser system. One suitable laser is a Quantronix Odin multipass amplifier seeded with a mode-locked Ti:Sapphire oscillator.

A suitable focusing lens includes a microscope objective having a magnification power of about 5× to about 20×. The focusing lens can have a numerical aperture (NA) of about 0.10 to about 0.30. An especially useful focusing lens is a 10×, 0.16 NA aspheric lens or 10×0.28 NA, Mitutoyo lens. A diffraction limited spot size of the focused laser beam was achieved using this lens. The working distance of the lens should be as long as possible commensurate with the NA.

The translation device may be any device capable of translating the sample with respect to the beam focus at the translation speeds of interest. For example, the translation speed lies in the range of about 1 $\mu$m/s to about 500 $\mu$m/s or faster, preferably from about 1 to 200. For example, a computer controlled XYZ positioning device, available from the Newport Co., can be used.

While the examples below refer to moving the glass sample with respect to a fixed focus, the skilled artisan will readily appreciate that alternatively the laser focus could be moved relative to a fixed sample, or both the laser focus and sample could be moved simultaneously with respect to a fixed reference point to achieve the desired relative translation speed between the sample and focus.

While the FIGS. 1–4 discussed above have depicted the glass samples suitable for use in the present invention as having substantially planar surfaces oriented at right angles to one another, the skilled artisan will recognize that the invention is not limited to such regular solid geometries. Rather, the invention can be used to direct-write patterns in virtually any regular- or irregular-shaped three-dimensional sample. It is preferred, however, that the sample be positioned relative to the incident laser beam such that the beam is substantially perpendicular to the surface of the sample through which the incident beam passes.

The composition of the glass substrates in which the light guiding structures may be written by this invention are described below in greater detail.

A. Borosilicate Glass

Borosilicate glasses are a known group of glasses that include boron and silica. Exemplary borosilicate glass include about 15 to about 85 mole % of $SiO_2$; about 10 to about 75 mole % $B_2O_3$, and from 0 to about 20% of other components. Borosilicate glasses have relatively low thermal expansion. Compositions such as PYREX™ were commercially exploited based on this property. These glasses also form the basis for "photochromic" glasses, glasses that darken when exposed to sunlight.

A unique property of the borosilicates are their propensity to separate into two separate phases, a silicate-rich phase, and a borate-rich phase. This property is exploited in the VYCOR™ brand glass that is phase separated by an additional thermal treatment. The glass is then treated in nitric acid to remove the soluble borate phase leaving a porous silica rich glass. The subsequent consolidation of this glass leads to the VYCOR™ brand product line. The present inventors have found that the inherent phase separable nature of borosilicates may play a role in their interaction with the fs-laser. Therefore, borosilicate glasses that most readily form separable phases are especially useful in the invention. However, any known borosilicate glass can be used in the present invention.

B. Sulfide Glasses

The sulfide glasses represent an analogous glass forming system to the oxygen-based system. Actually, the system is more chemically extensive in that it admits of such structures that contain S—S bonds or metal-metal bonds as well as the more oxide analogous metal-sulfur bonds. Sulfide glasses are glasses in which the sole or dominant anionic component is sulfur. Sulfide glasses have an absorption edge in the visible portion of the spectrum; this edge commonly lies at wavelengths in excess of about 450 nm giving these materials their characteristic yellow, orange or red coloration. Because of the greater size of sulfur relative to oxygen, the optical polarizability is significantly larger. This translates into a higher refractive index and significantly larger nonlinear effects.

The present invention demonstrates that those sulfide glasses for which the absorption edge lies between about 400 and 800 nm exhibit photorefractive behavior via two-photon absorption upon exposure to 810 nm radiation. Furthermore, sulfide glasses with the above characteristics that additionally contain either arsenic or antimony or both have been found to have a superior photorefractive response.

As seen in the example that follows, for the sulfide glasses, since their absorption edges were >400 nm, the 800 nm oscillator output (1–6 nJ, 30 fs, 80 MHz) was used to write the waveguide pattern. For these glasses it was important to choose the composition with no linear absorption at the excitation wavelength.

It has been found that the sulfide glasses exhibit large optical nonlinear response. This can be an advantage for certain applications such as optical switching and pulse compression. However, for the writing of waveguides by the technique described herein, it poses an additional problem which limits the usable glass compositions. The major attribute of nonlinearity that comes into play is what is termed "self-focusing." Here the change in the intensity-dependent refractive index across the beam tends to focus the beam, ultimately causing physical damage. The exposure power should be selected to be less than this self-focusing threshold.

C. Lead Glasses

Lead glass is a known group of glasses that include lead oxide. Lead is added to produce a larger refractive index change as well as higher dispersion. These glass have an absorption edge of around 300 nm or less.

Figure 5:
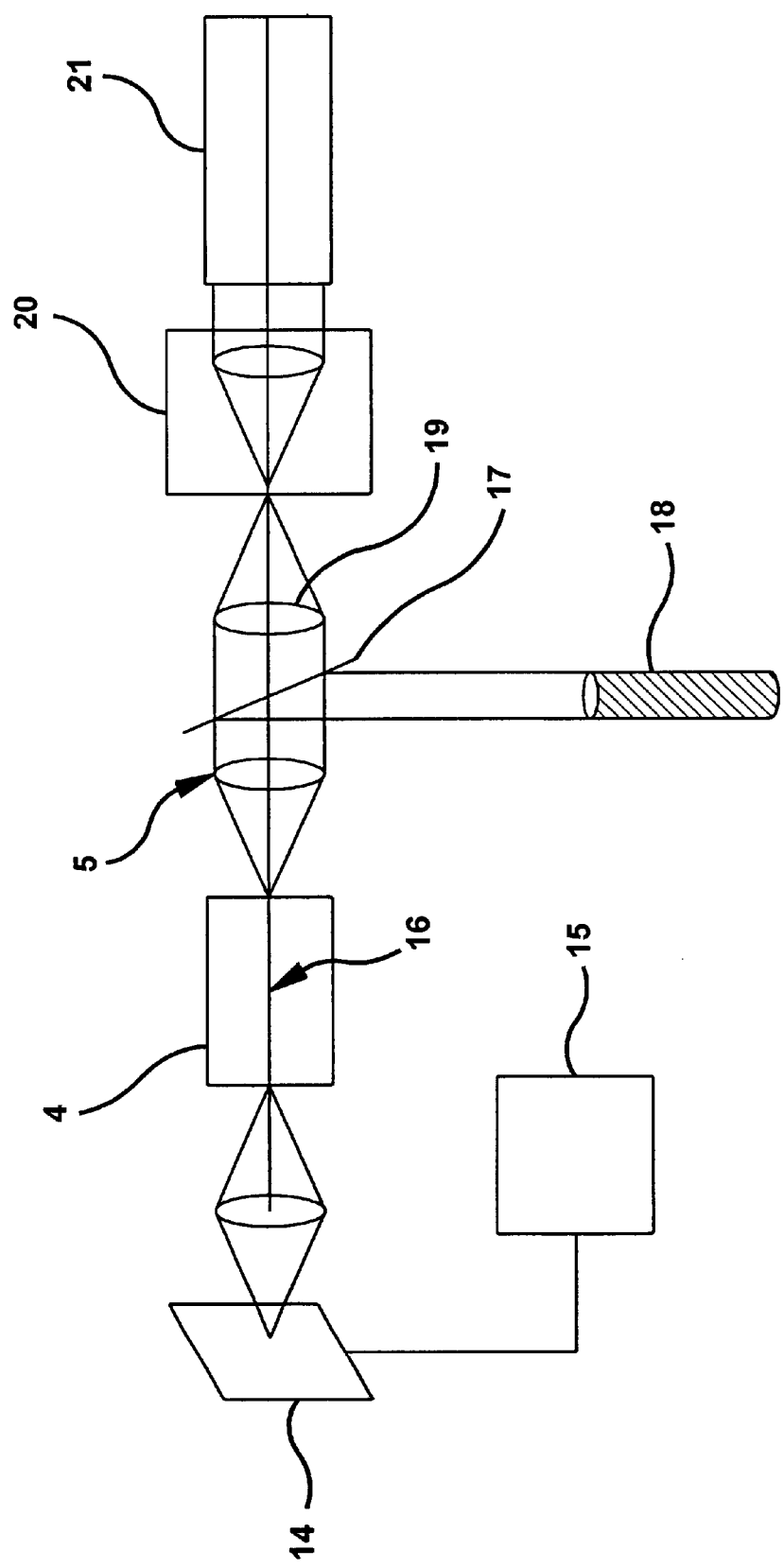
FIG. 5 is a schematic drawing of an equipment set-up for observing the far-field pattern.
Figure 6A:
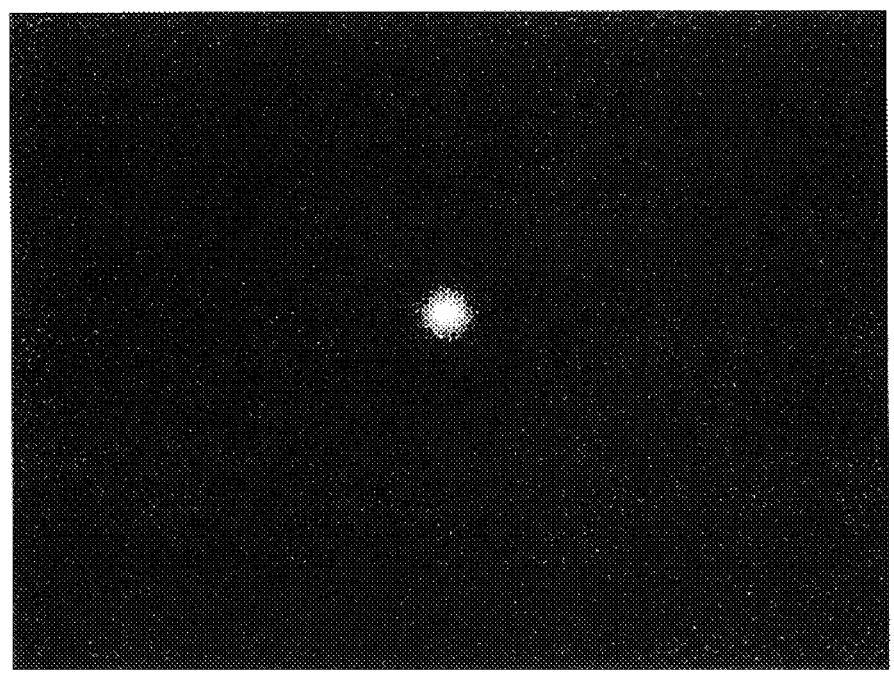
FIG. 6(a) is a near field pattern and FIG. 6(b) is a far field pattern of structures produced in lead glass according to the invention
Figure 6B:
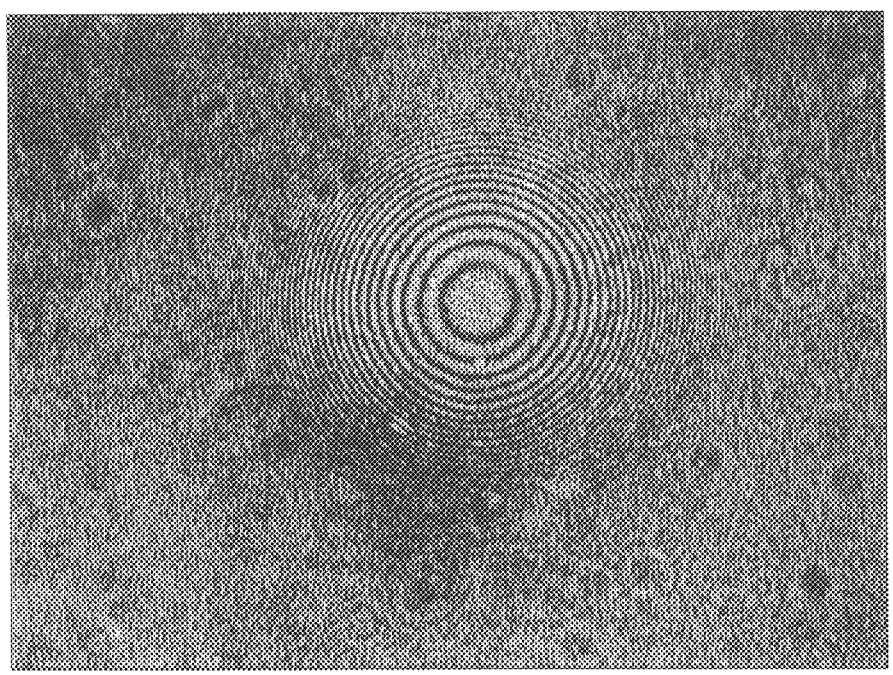

The induced refractive index changes reported below in connection with the examples were determined by the beam divergence method assuming a step index profile. A schematic of the experimental set-up for estimating the radiation-induced change in the refractive index in the pattern made according to the invention by this method is shown in FIG. 5. After writing a pattern or waveguide 16 in sample 4, by using a spatial filter 20, collimating lens 19, beam splitter 17, telescope 18, and lens 5, light from a HeNe laser 21 was coupled into the pattern 16 and the numerical aperture (NA) of the cone of light that emerged was measured. Since the length of the patterns made in the example below was typically 1 cm, unguided light from the HeNe interfered with the light coupled out the pattern. This interference resulted in an interference pattern of concentric rings in the far field as recorded by a digital camera 14 and personal computer 15.

The radius at which the fringes died out, $R_{fringe}$, was measured. The distance from the exit of the waveguides to the viewing surface, L, was fixed at 75 cm. The NA of the waveguide was calculated from the relation $$NA = R_{fringe}/L$$

Assuming a step index profile, the induced refractive index change $\Delta n$ was then calculated based on the relation $\Delta n = (NA)^2/2n$.

In order that the invention may be more readily understood, reference is made to the following examples, which are intended to be illustrative of the invention, but are not intended to be limiting in scope.

EXAMPLE 1

Borosilicate Glass

This example demonstrates that the exposure of borosilicate glass, to 30 fs pulses at a wavelength of 410 nm can produce a refractive index change of 0.0016. The conditions of the exposure are as follows. The 1 nJ beam was focused with a 0.28 NA lens and the focus was translated through the sample at a speed of 3 $\mu$m/s. The repetition rate was 80 MHz. The glass contained about 60.92% $SiO_2$; 2.34% $Al_2O_3$; 28.86% $B_2O_3$; 7.66% $Na_2O$ and 0.22 $Ag_2O_3$, all percent by weight. The absorption edge of the glass is about 300 nm.

Figure 7:
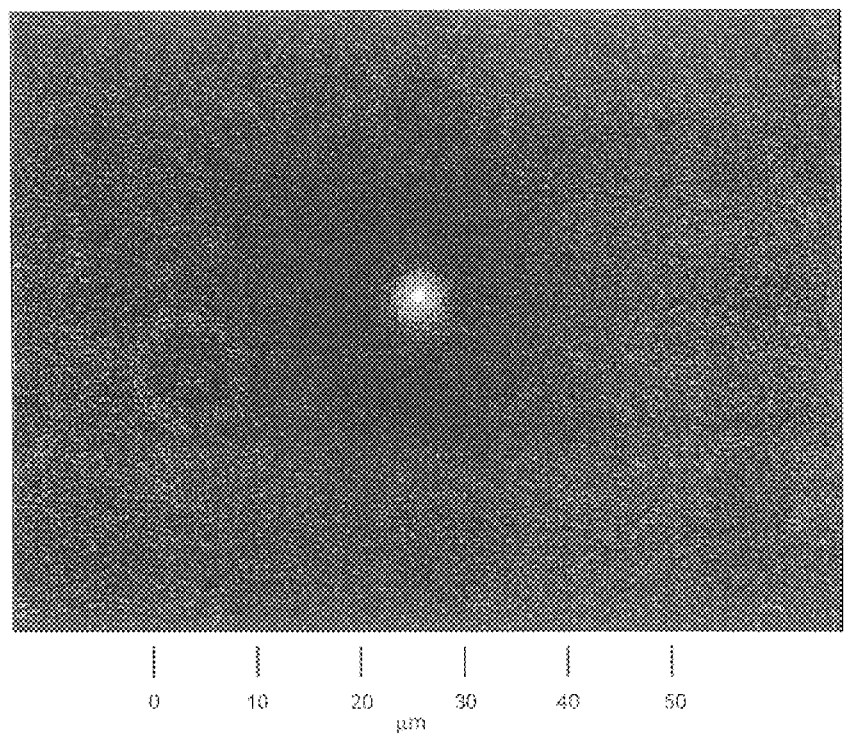
FIG. 7 shows the near-field intensity pattern of borosilicate glass exposed according to the invention.
Figure 8:
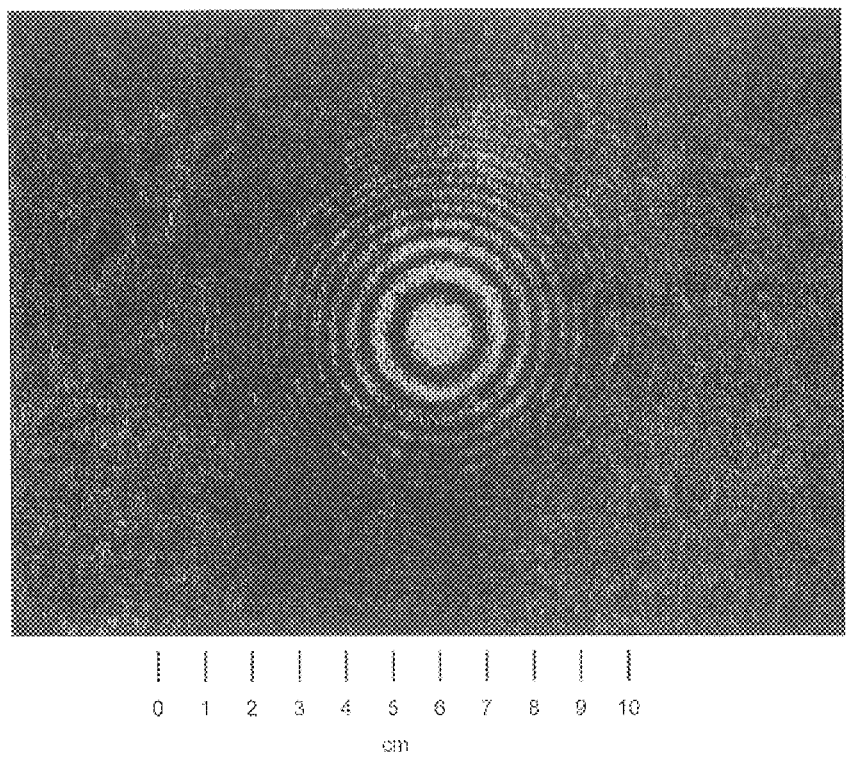
FIG. 8 shows the far-field intensity pattern of borosilicate glass exposed according to the invention.

The near-field intensity patterns is shown in FIG. 7. The induced refractive index change was estimated by the light guiding nature of the exposed region using a 633 nm He—Ne laser as the source. The far-field pattern produced is shown in FIG. 8. The NA of the light guide is estimated from the spatial extent of the circular fringe pattern.

The refractive index change in the borosilicate glass are the target induced index change observed with the output of the oscillator alone. The effect has not been observed in silica or boron-doped silica samples. For these silica samples, the threshold for the observation of induced refractive index changes is of the order of 100× greater. It is advantageous that for the borosilicate glass exposures only required a reduced output of the oscillator, and provided a much higher repetition rate and better beam stability.

EXAMPLE 2

Sulfide Glass

Using sulfide glasses, it is possible to move the intrinsic absorption edge within two-photon absorption range of the 810 nm source. The intrinsic absorption edge of these glasses is known to lie in the >450 nm region depending on the specific composition. The sulfide glass tested is shown in Table 1 below.

TABLE 1

| COMPONENT | (MOLE %) |
|---|---|
| $GeS_2$ | 83.3 |
| $Ga_2S_3$ | — |
| $As_2S_3$ | 8.33 |
| $P_2S_5$ | 8.33 |
| $Pr_2S_3$ | — |
| $\lambda_g$ (nm) intrinsic absorption edge | 508 |

The glass was tested using the following experimental set-up. The set-up included a focused fs-laser output from an oscillator delivering 30 fs pulses. The NA of the lens was 0.16. The focus was moved through the sample in an axial travel producing a cylindrically shaped exposed pattern through the thickness of the sample. The energy of the pulse was 2 nJ at a repetition rate of 80 MHz. The translational speed of the focus spot was varied from 20–200 $\mu$m.

Figure 9A:
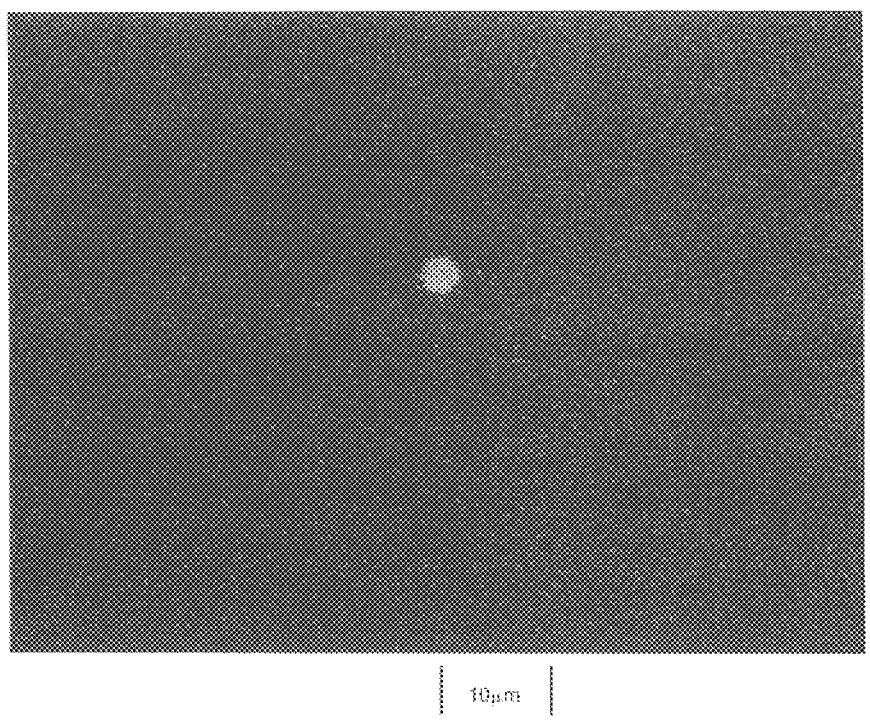
FIGS. 9a, 9b, and 9c are near-field patterns of waveguide structures produced in sulfide glass according to the invention.
Figure 9B:
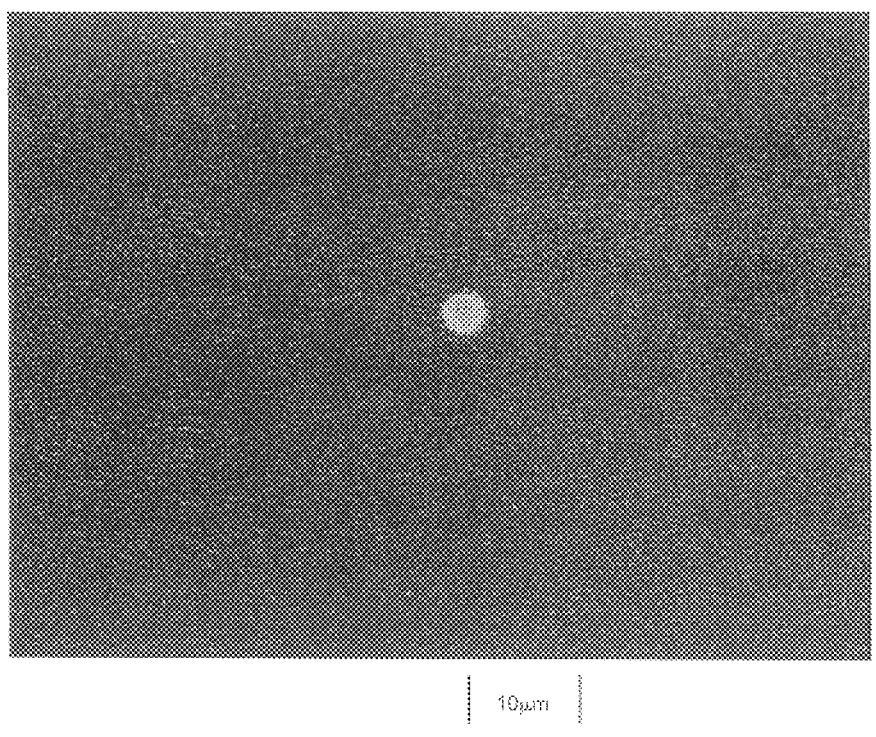
Figure 9C:
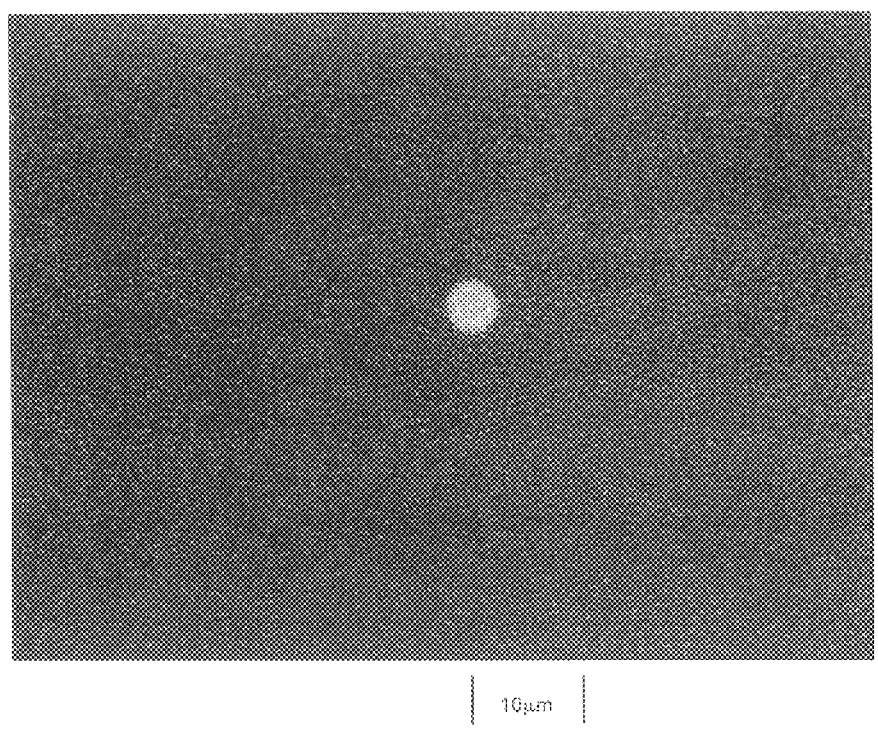
Figure 10A:
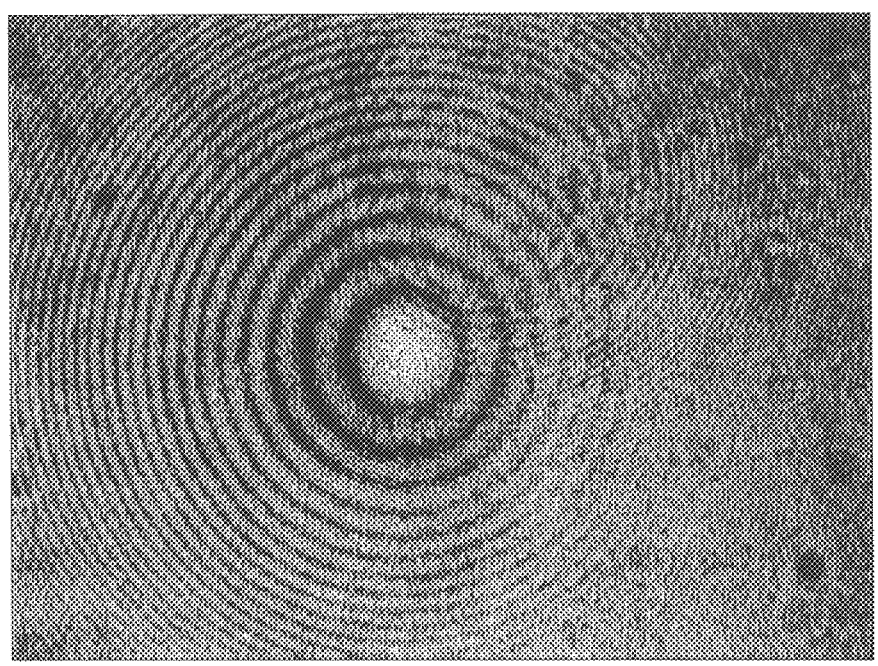
FIGS. 10a, 10b, 10c, and 10d are far-field patterns of waveguide structures produced in sulfide glass according to the invention.
Figure 10B:
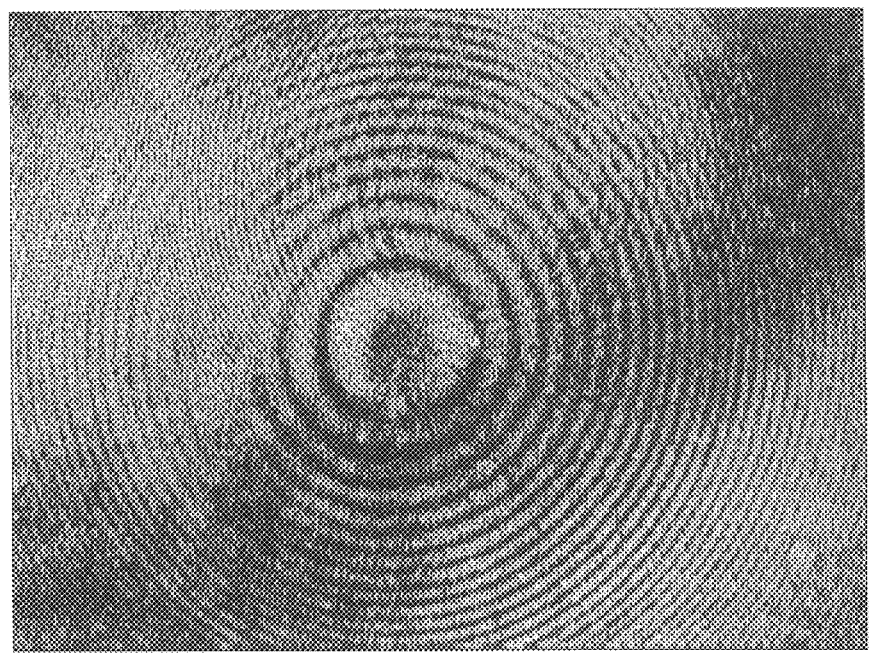
Figure 10C:
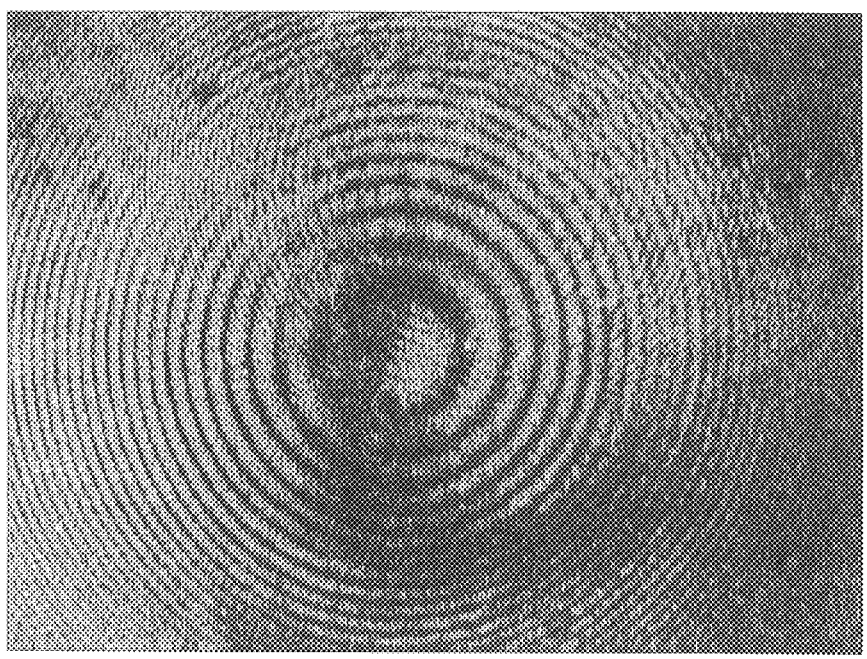
Figure 10D:
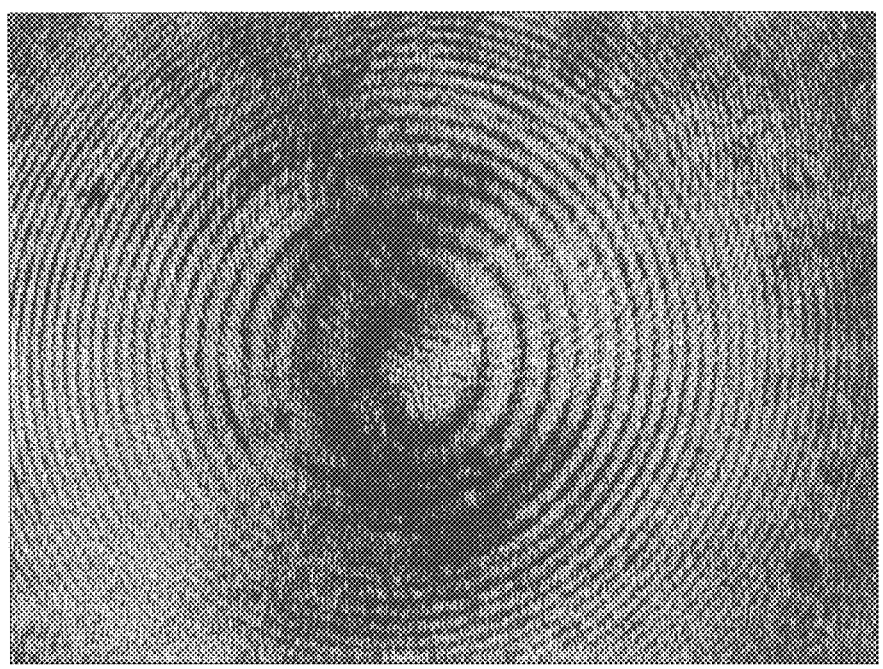

In FIGS. 9a, 9b, and 9c there is shown the near-field patterns for waveguiding structures as seen through a microscope for glass B. The translational speed is 100 $\mu$m/s in FIG. 9(a); 50 $\mu$m/s in FIG. 9(b); 20 $\mu$m/s in FIG. 9(c). The magnification is 60× in FIG. 9(a), FIG. 9(b), and FIG. 9(c). There is seen clear sharp boundary indicative of a large refractive index change. The estimate of the induced refractive index change was obtained from the exit angle of the emission from the guide in the far-field.

The measured far-field pattern is shown in FIGS. 10a–10d. The translation speed was 200 $\mu$m/s in FIG. 10(a); 100 $\mu$m/s in FIG. 10(b); 50 $\mu$m/s in FIG. 10(c), and 20 $\mu$m/s in FIG. 10(d). The technique measures the angular extent of the ring patterns as an estimate of the exit NA. The exit angle was at least equal to the input NA of 0.22. Using this estimate, the induced index change was >0.01. This is as large a value as obtained for any glass, irrespective of the pulse energy and/or wavelength.

EXAMPLE 3

This example compares the fs-laser-induced refractive index in the borosilicate glass of Example 1, for different exposure conditions attained at the same laser pulse energy and different speeds of sample translation. The exposure conditions were: Pulse energy 2.5 nJ, $\lambda_{ex}$=400 nm, and pulse duration of 30 fs. The results are shown in Table 2 below.

TABLE 2

| Speed, $\mu$m/s | 1 | 3 | 5 | 10 | 20 |
|---|---|---|---|---|---|
| $\Delta$n, ×$10^{-3}$ | 1.8 | 1 | 0.8 | 0.6 | 0.5 |

EXAMPLE 4

This example demonstrates that the exposure of lead glass according to the invention can produce desired refractive index changes.

Lead Glass Composition (in Wt %)
$SiO_2$-10.29, $Al_2O_3$-12.2, $B_2O_3$-37.95, $Na_2O$ -0.06, $K_2O$-1.09, ZNO-0.13, PbO-33.88, $La_2O_3$-2.50, $ZrO_2$-0.97, $As_2O_3$-0.27, $Sb_2O_3$-0.02.

The exposure conditions were: Pulse energy–2.5 nJ, $\lambda_{ex}$–400 nm, pulse duration of 30 fs, speed–3 $\mu$m/s, $\Delta$n (refractive index change)=1.613×$10^{-3}$.

Figure 11A:
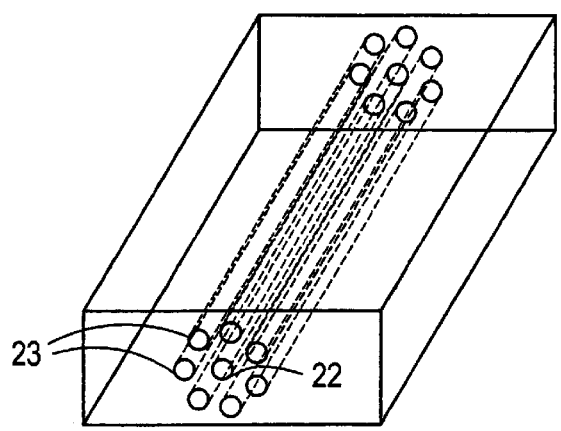
FIGS. 11a, 11b, 11c, and 11d are optical devices that can be made according to the invention.
Figure 11B:
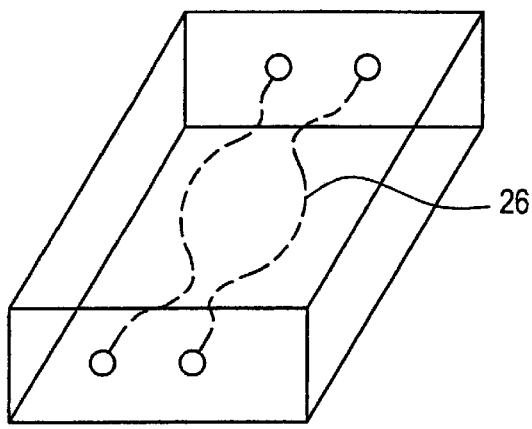

The measured near field pattern is shown in FIG. 11a and the measured far field pattern is shown in FIG. 11b.

Figure 11C:
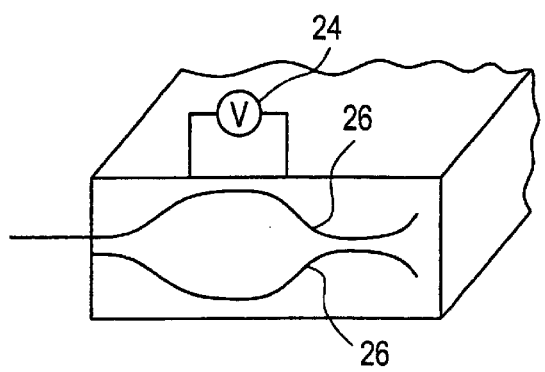
Figure 11D:
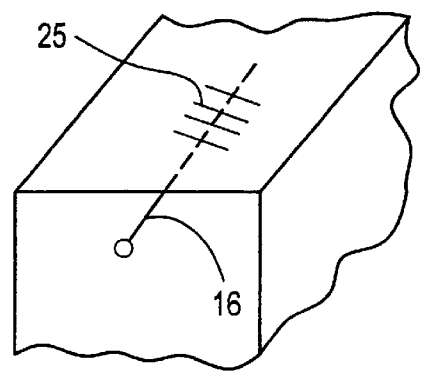

In addition to waveguides, the present invention can also be used to make a wide variety of other optical devices, such as the star coupler having central guide 22 surrounded by a plurality of peripheral guides 23, as shown in FIG. 11(a). The invention can also be used to make a passive Mach-Zehnder coupler including a pair of Mach-Zehnder guides 26, as shown in FIG. 11(b). An active Mach-Zehnder coupler including Mach-Zehnder guides 26 and a thermal or other type activator 24, as shown in FIG. 11(c), could also be made using this invention. The present invention can also be used to make Bragg or other type diffraction gratings in glass, as shown in FIG. 11(d), and also loop mirrors, demux couplers, rare earth doped single- or multi-stage amplifiers, e.g., a Er-doped single- or multi-stage amplifier, and devices having surface-modified thermal, piezoelectric, or trench-type activators. As shown in FIG. 11(d), waveguide 16 leads to grating lines 25. Long-period gratings, e.g., those having a grating period of about 100 to about 1000 $\mu$m, can be made using this invention.

The invention can also be used to make interferometers or phased arrays. Also, integrated optical waveguide devices in a single glass body which utilizes multiple optical waveguide structures and paths integrated and combined together to manipulate and operate on light transmitted through the glass, such as performing a function of an inputted optical waveguide channel and an integrated optical waveguide devices which separates/combines optical waveguide channels based on wavelengths, can be made.

It will be understood that the above described embodiments of the present invention are susceptible to various modifications, changes, and adaptations, and the same are intended to be comprehended within the meaning and range of equivalents of the appended claims.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. A method of writing a pattern in a bulk glass substrate having an absorption edge ($\lambda_g$), comprising focusing a pulsed laser beam having a wavelength ($\lambda_{ex}$) such that $\lambda_g \angle \lambda_{ex} \angle 2\lambda_g$, at a focus within said substrate while translating the focus relative to the substrate along a scan path at a scan speed effective to induce an increase in the refractive index of the material along the scan path relative to that of the unexposed material while incurring substantially no laser induced breakdown of the material along the scan path, wherein the bulk glass substrate comprises a borosilicate glass.

2. A method of writing a pattern in a bulk glass substrate having an absorption edge ($\lambda_g$), comprising focusing a pulsed laser beam having a wavelength ($\lambda_{ex}$) such that $\lambda_g \angle \lambda_{ex} \angle 2\lambda_g$, at a focus within said substrate while translating the focus relative to the substrate along a scan path at a scan speed effective to induce an increase in the refractive index of the material along the scan path relative to that of the unexposed material while incurring substantially no laser induced breakdown of the material along the scan path, wherein the bulk glass substrate comprises a sulfide glass.

3. A method of writing a pattern in a bulk glass substrate having an absorption edge ($\lambda_g$), comprising focusing a pulsed laser beam having a wavelength ($\lambda_{ex}$) such that $\lambda_g \angle \lambda_{ex} \angle 2\lambda_g$, at a focus within said substrate while translating the focus relative to the substrate along a scan path at a scan speed effective to induce an increase in the refractive index of the material along the scan path relative to that of the unexposed material while incurring substantially no laser induced breakdown of the material along the scan path, wherein the bulk glass substrate comprises a lead glass.

4. A method of writing a pattern in a bulk glass substrate selected from the group consisting of borosilicate, sulfide, and lead glass comprising focusing a femtosecond pulsed laser beam at a focus within said substrate while translating the focus relative to the substrate along a scan path at a scan speed effective to induce an increase in the refractive index of the material along the scan path relative to that of the unexposed material while incurring substantially no laser induced breakdown of the material along the scan path.

5. The method of claim 4, wherein the bulk glass substrate comprises borosilicate glass.

6. The method of claim 4, wherein the bulk glass substrate comprises sulfide glass.

7. The method of claim 4, wherein the bulk glass substrate comprises sulfide glass comprising one or both of arsenic or antimony.

8. The method of claim 4, wherein the glass comprises a lead glass.

9. A method of writing a pattern in a bulk glass substrate having an absorption edge ($\lambda_g$), comprising focusing a pulsed laser beam having a wavelength ($\lambda_{ex}$) such that $\lambda_g \angle \lambda_{ex} \angle 2\lambda_g$, at a focus within said substrate while translating the focus relative to the substrate along a scan path at a scan speed effective to induce an increase in the refractive index of the material along the scan path relative to that of the unexposed material while incurring substantially no laser induced breakdown of the material along the scan path, wherein the pulse energy is within the range from about 0.5 nJ to about 10 nJ.

10. The method of claim 9, wherein the peak intensity of said laser beam at the focus is at least about $10^{10}$ W/cm$^2$.

11. The method of claim 9, wherein the laser pulse duration is from about 20 fs to about 100 fs.

12. The method of claim 9, wherein the laser repetition rate is from about 0.5 to about 100 MHz.

13. The method of claim 9, wherein the pulse energy is further limited within the range from about 1 nJ to about 3 nJ.

14. The method of claim 9, wherein the scan speed is from about 1 $\mu$m/s to about 500 $\mu$m/s.

15. The method of claim 9, wherein the focus is translated relative to the substrate in a scan direction that is substantially parallel to the laser beam.

16. The method of claim 9, wherein the focus is translated relative to the substrate in a scan direction that is substantially perpendicular to the laser beam.

17. The method of claim 9, wherein the focus is translated relative to the substrate in three dimensions.

18. The method of claim 9, wherein the pattern is a light guiding structure.

19. The method of claim 9, wherein translation of the focus once along the scan path induces a refractive index increase of more than about 0.0001.

* * * * *